United States Patent [19]

Bhandarkar

[11] 3,999,172
[45] Dec. 21, 1976

[54] MAGNETIC DOMAIN MEMORY

[75] Inventor: Dileep Pandurang Bhandarkar, Dallas, Tex.

[73] Assignee: Texas Instruments Incorporated, Dallas, Tex.

[22] Filed: Nov. 29, 1974

[21] Appl. No.: 528,119

[52] U.S. Cl. .......................................... 340/174 TF
[51] Int. Cl.$^2$ ........................................ G11C 19/08
[58] Field of Search ............................. 340/174 TF

[56] References Cited
UNITED STATES PATENTS

| | | | |
|---|---|---|---|
| 3,737,882 | 6/1973 | Furuoya | 340/174 TF |
| 3,806,901 | 4/1974 | Buhrer | 340/174 TF |
| 3,838,407 | 9/1974 | Juliussen | 340/174 TF |

OTHER PUBLICATIONS

IEEE Transactions on Computers—vol. C-22, No. 3, Mar. 1973, pp. 269–275.

Primary Examiner—James W. Moffitt
Attorney, Agent, or Firm—Harold Levine; James T. Comfort; William E. Hiller

[57] ABSTRACT

A magnetic domain memory having a layer of magnetic material in which magnetic domains can be moved under the influence of an external magnetic force. The memory includes a plurality of closed loops for the storage and guided movement of magnetic domains. Each magnetic domain in each memory storage loop has a virtual position with respect to all the other magnetic domains in that loop. A magnetic domain generator creates the magnetic domains for movement along an input path to the memory storage loops. A separate output path allows movement of the magnetic domains from each memory storage loop to a detection point where a detector senses the presence of magnetic domains. A first one-way gate at a first point on each loop transfers magnetic domains from the input path into that loop. A second one-way gate at a second point on each loop transfers magnetic domains from that loop to the output path. A transfer control, synchronized with the movement of the magnetic domains, selectively operates the first and second one-way gates. Thus, when a magnetic domain is transferred out of its virtual position in a memory storage loop at the second point on that loop by the second one-way gate, a new magnetic domain may be transferred into the same virtual position by the first one-way gate when the virtual position next reaches the first point on that loop.

6 Claims, 5 Drawing Figures

MAGNETIC DOMAIN MEMORY

BACKGROUND OF THE INVENTION

This invention relates to a magnetic domain memory and more particularly to a memory in which a magnetic domain may be inserted into a position in a memory storage loop in the minimum amount of time after a magnetic domain previously in that position has been transferred out of that position.

Magnetic domain memories generally include one or more memory storage loops, each accommodating a number of magnetic domains and with each domain representing one bit of binary information. Each magnetic domain in a loop has a virtual position with respect to all other magnetic domains in the same loop. The magnetic domains are rotated around the loop in a controlled manner, so that a magnetic domain passes a particular point on the loop only periodically.

Prior magnetic domain memory systems have used one continuous path to move magnetic domains to and from the storage loops comprising the memory. In one such system, a closed continuous path is used with a bidirectional transfer gate for each loop for moving the magnetic domains between the storage loop and the path. Because the magnetic domain positions pass this gate only once per revolution about the loop, two revolutions are necessary between each retrieval of a magnetic domain since after the first magnetic domain is retrieved or transferred out of the loop a new one must be put in its old position before a second retrieval can occur. Where the same bit information is required repeatedly these relatively long time periods between successive retrievals substantially increase the operational time required to perform such functions.

A second type organization designed to speed up the storage of magnetic domains has an unclosed path which passes each memory storage loop at two points. At each of these points there is a one-way gate connecting the storage loop and the path. One gate transfers magnetic domains into the storage loop, while the other transfers the domains out of the storage loop. Since magnetic domains are now moved into and out of the storage loops at separate points, the access to a magnetic domain position depends on how many times the virtual position of the magnetic domain has to move around the loop from the output point to the input point before the new magnetic domain, moving along the path, will be at the input transfer point. Presently, a minimum of one and one-half revolutions of the virtual position from the output to the input transfer point is required. This is because of the length of the path. Thus, in this arrangement as in the one first discussed above, there can be no continuous transfer of magnetic domains into and out of the memory storage loop positions. Rather, there is still a substantial time interval between transfers into and out of the same virtual position in the storage loop.

SUMMARY OF THE INVENTION

Among the several objects of the present invention may be noted the provision for a magnetic domain memory in which the time between successive accessing operations of the magnetic bubble domain information is reduced; the provision of such a memory in which magnetic domains may be transferred into a virtual position in a memory storage loop each time the virtual position reaches the input transfer point on the loop after a magnetic domain in that virtual position has been removed from that position at the output transfer point on the loop; the provision of such a memory which permits continuous transfer of magnetic domains into and out of memory storage loop positions, allows simultaneous read and write operations and can be easily interfaced with other units in a functional system; the provision of a memory of the class described which offers easy and convenient alteration of data before rewriting it and wherein such data modification does not slow the functions of memory accessing at current logic speeds, and the provision of such a memory which is simple in design, economical in construction and reliable in operation. Other objects and features will be in part apparent and in part pointed out hereinafter.

Briefly, a memory of the present invention is useful for the continuous rapid storage of magnetic domains in specific memory locations even though the magnetic domains stored in these locations are continuously transferred out of the memory locations for desired information utilization. According to a preferred form, such a magnetic domain memory comprises a layer of magnetic material in which magnetic domains can be moved under the influence of an external magnetic field. It includes at least one closed loop in which magnetic domains are stored, with each domain in a loop having a virtual position with respect to all the other magnetic domains in the loop. These magnetic domains are moved around the loop in a controlled manner. A magnetic domain generator provides magnetic domains to an input path along which they are moved to the memory storage loop. A one-way gate at a first point on the loop transfers the magnetic domains from this input path into the memory storage loop. An output path, separate from the input path, permits movement of magnetic domains away from the memory storage loop to a point where a detector senses the presence of magnetic domains and provides an equivalent logic output. A one-way gate at a second point on the loop transfers the magnetic domains from the memory storage loop to this output path. A transfer control, synchronized with the movement of the magnetic domains, is used to selectively operate both one-way gates to move the magnetic domains into or out of the storage loop. As a result, when a magnetic domain is transferred out of its virtual position in the memory storage loop at the second point on the loop a new magnetic domain may be transferred into the same virtual position the next time the virtual position reaches the first point on the loop.

BRIEF DESCRIPTION OF THE DRAWINGS

Corresponding reference characters indicate corresponding parts throughout the several views of the drawings.

DESCRIPTION OF PREFERRED EMBODIMENTS

Figure 1:
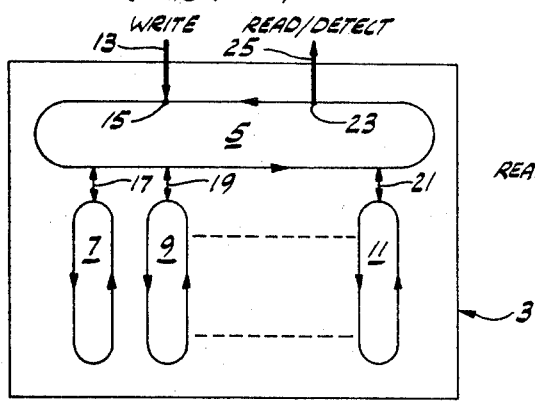
FIG. 1 is a representation of a prior art magnetic domain memory chip organization.

Referring now to the drawings, and more particularly to FIG. 1, a prior magnetic domain memory chip is generally indicated at 1. This memory organization comprises a suitable magnetic layer 3, such as epitaxial magnetic garnet film on a nonmagnetic garnet substrate, and has a major loop 5 around which magnetic domains are moved, and a number of storage loops, of which three, 7, 9 and 11, are shown. These loops are defined by any of the conventional means such as patterns of magnetically soft overlay material of bar and T-shaped segments, etc. The magnetic bubble domains are synchronously circulated or propagated unidirectionally around the loops by any customary means such as by an in-plane rotating magnetic field, such chip organizations being described in more detail in U.S. Pat. No. 3,618,054, for example. Magnetic domain travel in loops 5, 7, 9, and 11 is shown, although it is to be understood that the direction of movement in both the major and storage loops may be in either direction and the direction shown here is for illustrative purposes only.

Information to be stored in the minor loops is introduced into the memory as follows: In response to a control signal or pulse supplied at 13, magnetic domains are introduced at a point 15 into major loop 5. The magnetic domains are then moved around major loop 5 in the direction shown. As the domains are stepwise moved around major loop 5 in a controlled manner, they sequentially pass two-way transfer gates 17, 19 and 21 which give access to the storage loops 7, 9 and 11, respectively. A two-way gate such as 17, 19, or 21 is a bidirectional device which allows magnetic domains to move in either direction between two separate paths. If, as a magnetic domain arrives at a transfer gate of the minor loop in which it is to be stored, that gate is selectively operated, the magnetic domain is then transferred from the major loop 5 into a storage loop, for example, loop 9. Once in the storage loop 9, the magnetic bubble is controllably propagated around the loop in the direction shown. A magnetic domain placed in storage loop 9 has a virtual position with respect to all the other magnetic domains in the same storage loop. This means that its relationship to all the other domains will not change as the domains rotatably move around the storage loop. Further, once a magnetic domain has been transferred out of the storage loop, nothing remains in the virtual position which the domain occupied.

When a stored magnetic domain is to be retrieved or accessed, it is removed from its storage loop as follows: Assume the stored magnetic domain is in loop 9. As the stored domain arrives at the transfer gate 19 in its rotation around the loop, transfer gate 19 is selectively operated and the magnetic domain is moved out of loop 9 to major loop 5. The magnetic domain is then moved stepwise around major loop 5 in the direction shown until it reaches a point 23 where it may be replicated and sensed to generate an equivalent logic signal at 25, and the original bubble continues to be circulated around loop 5.

In this configuration, each position in a storage loop can be accessed only once per rotational cycle, this occurring as the storage or virtual position moves past its respective two-way transfer gate. If information stored in the memory is to be used repeatedly, it must be retransferred or rewritten into the storage location after it has first been transferred out. Thus, where repeated usage is required, first the domain is transferred out of the storage loop 9 and moved to point 23 for replication by means of major path 5. When the virtual position occupied by the magnetic domain reaches the gate 19 again, a new magnetic domain is transferred from major path 5 into the virtual position. Now when the virtual position again reaches gate 19 in its next rotational cycle, the newly stored magnetic domain can again be transferred out of the virtual position to major path 5 to be moved to point 23. Therefore, two rotations of any memory location in a storage loop past the two-way transfer gate of that loop are required in order to perform a repeated retrieval of magnetic domains with respect to that memory location.

Figure 2:
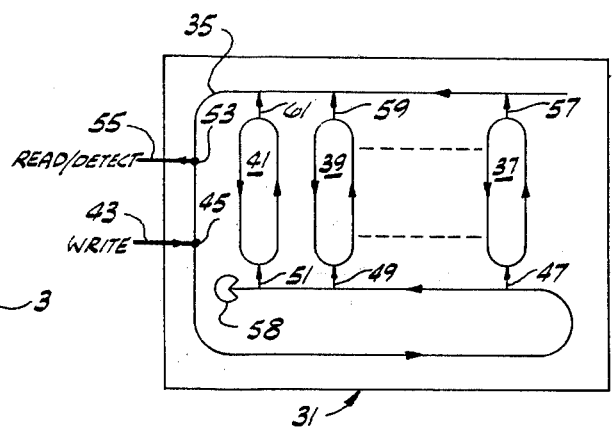
FIG. 2 is a representation of another prior art magnetic domain chip organization.

Referring now to FIG. 2, a second prior magnetic domain memory organization is generally indicated at 31 and has a major path 35 and a number of storage loops, of which three, 37, 39 and 41, are shown. Magnetic domains to be stored in the memory are introduced to path 35 at a point 45 in response to a write signal at 43. The domains are then moved onto and around major path 35 in the direction shown to sequentially pass one-way transfer gates 47, 49 and 51 which gives access to memory storage loops 37, 39 and 41, respectively. One-way transfer gates are simpler in design than the two-way gates previously discussed, and they permit only unidirectional movement of magnetic domains between two paths. As a magnetic domain arrives at the transfer gate of the loop in which it is to be stored, that gate is selectively energized and the domain is transferred from major path 35 into the storage loop where it is placed in a virtual position with respect to all the other domains, and is controllably rotated therearound the loop in the direction shown.

Retrieval of magnetic domains from a storage loop is as follows: As a domain in loop 39, for example, is rotated therearound, it passes a one-way transfer gate 59 similar to the one-way transfer gate 49 through which a domain was originally introduced into loop 39. Each storage loop has a second one-way transfer gate, gates 57 and 61 being for storage loops 37 and 41, respectively. As the domain arrives at transfer gate 59, it is transferred from loop 39 to major path 35 upon that transfer gate being appropriately pulsed. The domain is then moved along major path 35 in the direction shown until it reaches a junction 53 for reading or detection and generation of a logic signal at 55.

An annihilator 58 is located at the end of the major path 35 to destroy any spurious domains which may remain on major path 35.

With this configuration, because of the required physical length of major track 35, a magnetic domain which is transferred out of its virtual position in a storage loop, cannot be re-inserted into the same virtual position until that position has rotated at least 1½ revolutions around the loop from the gate where domains are transferred out to the gate where domains are transferred in. Therefore, the information represented by a magnetic domain cannot be retrieved from the same memory location until two revolutions, at least, of a virtual position about the storage loop. Thus, where information is repeatedly required, the domain is transferred from its virtual position to major path 35 at one-way output transfer gate 57, 59, or 61. The virtual position is then rotated one complete revolution about the storage loop, so that it passes the input one-way transfer gate 47, 49, or 51. On its next revolution, as the virtual position passes one-way transfer gates 47, 49, or 51, a new magnetic domain is now in position on major path 35 to be transferred into the storage loop virtual position. Then when the virtual position next passes output gate 57, 59, or 61, or two complete rotations of the virtual position around the storage loop after the first retrieval, the newly stored domain can be retrieved.

Figure 3:
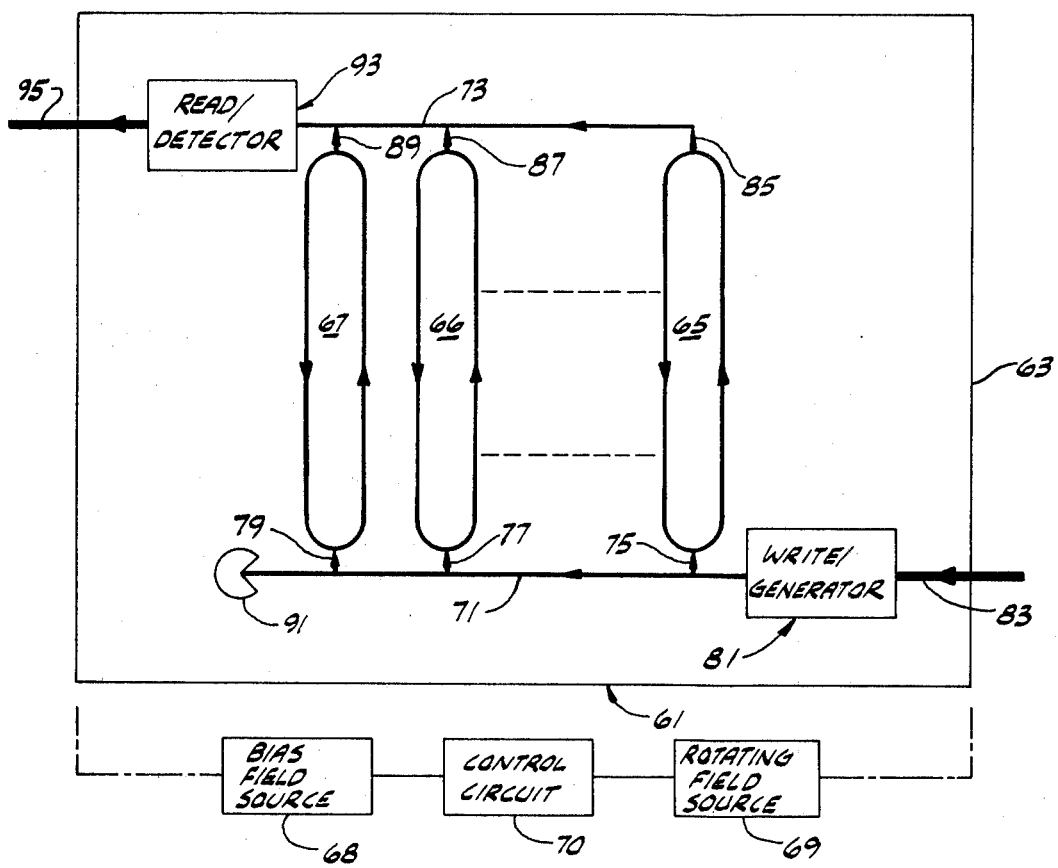
FIG. 3 is a representation of a magnetic domain memory chip organization in accordance with the present invention.

Referring now to FIG. 3, a magnetic domain memory of the present invention is generally shown at 61 and comprises a layer of suitable magnetic material 63 in which bubble domains may be moved. Memory 61 includes a number of memory storage loops, of which three, 65, 66 and 67, are shown. A bias field supplied by a source 68 maintains the magnetic domains at a desired size, while a rotating source 69 is provided for generating an in-plane magnetic field for synchronously advancing the bubble domains simultaneously around the loops and along other paths as will be described, all as is well known in this art. A control circuit 70 performs the customary function not only of controlling the rotating field but also the transfer gates, the read or detect and the write or generate components as will be described. It will be understood that current access can also be used instead of the magnetic field for synchronously advancing the bubble domains. Source 69 constitutes means for causing movement of the bubbles or domains within layer 63. The loops are positioned between two substantially equidistantly spaced paths 71 and 73 for movement of domains therealong in the directions indicated. Path 71 constitutes an input path for movement of domains to the storage loops while path 73 is entirely separate and provides an output path for movement of domains from the loops. It is to be noted that input path 71 and output path 73 as described form a two-part segmental major loop as compared with the continuous major loop 5 of FIG. 1 or the unbroken path 35 of FIG. 2.

A writing device or bubble generator 81 under the control of circuit 70 via a control conductor 83 is located at the beginning of input path 71 and an annihilator 91 is provided at the opposite end. Path 71 is formed as was major loop 15 in FIG. 1 or path 35 in FIG. 2 by a pattern of magnetically soft overlay material for stepwise incremental unidirectional movement of magnetic domains in response to external commands from circuit 70. Movement from generator 81 to annihilator 91 is as indicated.

To store information in the memory, writing device 81 generates a number of magnetic domains in response to electronic input commands via 83 from control circuit 70, and the generated domains are moved by the rotating field along input path 71 in the direction shown. As the domains move along input path 71, they sequentially pass one-way input transfer gates 75, 77 and 79 of storage loops 65, 66 and 67, respectively. As a domain arrives at the gate of the loop in which it is to be stored, that gate is selectively operated by a transfer pulse from control circuit 70, and the domain is transferred from input path 71 into the memory storage loop. In the storage loop, the magnetic domain is placed in a virtual position with respect to all the other magnetic domains in the same loop. These domains rotate around the loop, as shown, with each magnetic domain maintaining its virtual position. Magnetic domains remaining on input path 71 at the end of the path are destroyed by annihilator 91.

Control circuit 70, which operates the input one-way transfer gates, also controls output one-way transfer gates 85, 87 and 89 via control conductors (not shown) by control signals such as pulses which are synchronized with the movement of the magnetic domains so that the gates will open to transfer a domain out of a storage loop only when the proper magnetic domain, required for retrieval, is at the appropriate gate.

To retrieve information stored in the memory 61, assume a magnetic domain stored in loop 66 and circulating in its virtual position therearound. As the storage location of the domain moves around loop 66, it passes output one-way transfer gate 87. As the position in which the domain is stored arrives at gate 87, gate 87 is selectively operated by control circuit 70 and the domain is transferred out of its position in loop 66 to output path 73. The domain then moves along output path 73 to a read/detector 93. Detector 93 senses the presence or absence of a magnetic domain and provides a discrete output signal at 95 corresponding to this presence or absence. By monitoring the read/detector 93 output and properly controlling the actuation of writing device 81 by control circuit 70, the same binary information read may be regenerated in the form of magnetic domains by means of writing device 81 preferably simultaneously with the sensing of a magnetic domain by the read/detector 93 by a command signal from control circuit 70 to generator 81 applied to generator control conductor 83. If the relationship $B=4N$ is satisfied, where $N =$ the number of storage loops, and
$B =$ the number of storage positions in each loop, then magnetic domains generated by writing device 81 simultaneously with the sensing of magnetic domains by the read/detector 93 are replaced in the same virtual positions in the loops out of which the domains were transferred, when those virtual positions in the storage loops first rotate from the output one-way transfer gates 85, 87, 89 to the input one-way transfer gates 75, 77, 79. Therefore, binary information repeatedly required will be available with every cycle of rotation of the virtual positions about the storage loop. This permits a continuous transfer of information. If $B > 4N$, simultaneous detection and generation is not required, and control circuit 70 will not actuate generator 81 until such time that a magnetic domain generated at 81 will arrive at the input gate 75, 77, or 79 coincident with the virtual position in the loop in which the domain is to be stored also being at the input gate. If $B < 4N$, storage of domains may occur with the second passing of the loop virtual position past the input gate after retrieval has occurred at the output gate. The preferred embodiment of this invention is when $B \geq 4N$.

It is to be noted that the above memory can be operated using only three control conductors; one to the input transfer gates, one to the output transfer gates, and one to the domain generator, in addition to the detector signal lead 95.

In the memory domain organization shown in FIG. 3, when the information stored in the memory is to be used repeatedly, it must be restored in the storage loop positions prior to every retrieval in the manner discussed above. The embodiment shown in FIG. 4 performs the same function as that shown in FIG. 3. However, the FIG. 4 embodiment provides for retention of bubble domains in the memory loops during retrievals which gives the memory protection against soft read errors since nondestructive read out may be employed.

Figure 4:
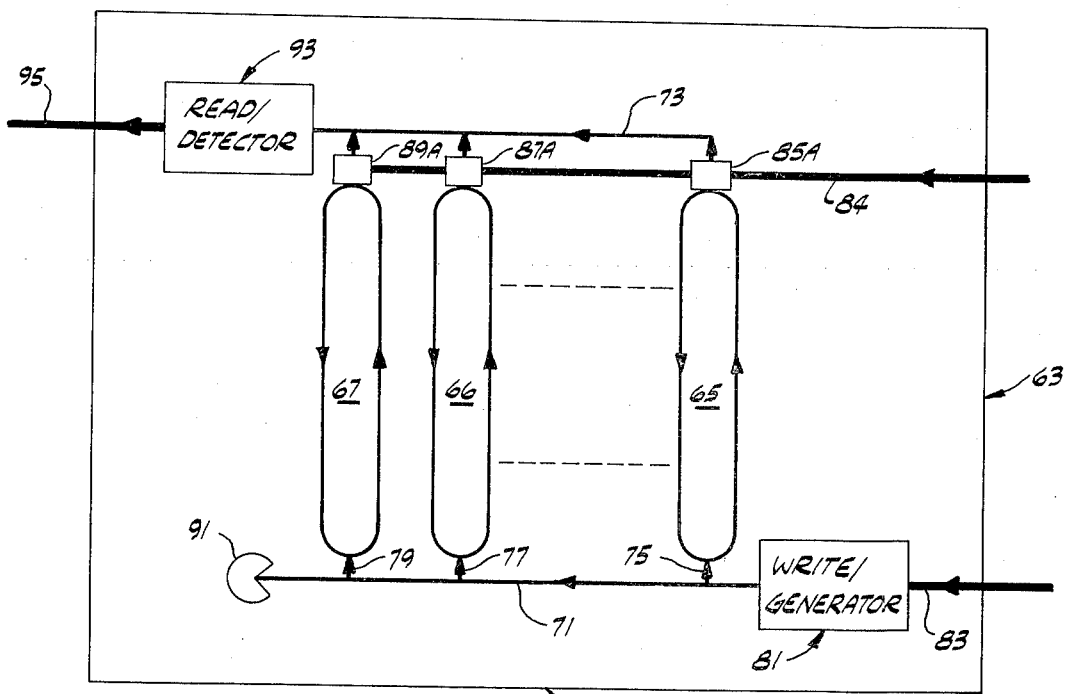
FIG. 4 is a representation of a second embodiment of the present invention.

FIG. 4 has a memory 61A which corresponds to memory 61 of FIG. 3 except that instead of one-way transfer gates 85, 87 and 89 it employs similar gates 85A, 87A and 98A which incorporate a replicate function. Additionally a replicate control conductor 84 is provided to selectively supply appropriate replicate control pulses to the respective one-way transfer/replicate gates 85A, 87A, and 89A to cause replication of a magnetic domain in a storage loop at the gate thereof.

If the binary information represented by magnetic domains stored in the memory loops is required repeatedly, then memory 61A of FIG. 4 may be operated as follows. As a magnetic domain arrives at the output one-way replicate/transfer gate for its loop, a replicate pulse is applied on conductor 84 to the gate to cause the magnetic domain to be replicated. When this occurs, the domain at the output transfer gate is replicated or duplicated, so that two domains now exist at the gate. One domain is transferred to output path 73. The other domain then continues to be circulated around the storage loop in the original virtual position. The domain transferred to path 73 travels on output path 73 to read/detector 93 where the presence of magnetic domains is sensed. Thus, a magnetic domain may be retained in the storage loop while a duplicate of the domain is detected to provide an output at 95, and the necessity to generate and replace the information in the storage loop for the next usage is eliminated.

If stored information is to be replaced with new information, the domains are transferred out of the storage loop to output path 73. As the virtual position of a stored magnetic domain arrives at the replicate/transfer gate, a transfer pulse, different from the replicate pulse, is applied to the transfer/replicate gate and the transfer portion of the gate is selectively operated thereby transferring the domain from the loop to output path 73. Nothing is retained in the storage loop. The domain traveling on output path 73 is sensed by a read/detector 93 which provides an output signal at 95. New magnetic domains may now be synchronously generated and selectively stored in the loops in the manner previously discussed in regard to FIG. 3. This embodiment thus has the advantages of a memory organization as shown in FIG. 3 with the added advantage of optional information retention during utilization.

Alternatively, the memory 61A of FIG. 4 may include gates 85A, 87A, and 89A which combine a replicate function with an annihilate function thereby comprising one-way replicate/annihilate gates. In this form of the memory 61A shown in FIG. 4, when stored information is to be overwritten with new information, the domains are annihilated from the storage loop. As the virtual position of a stored magnetic domain arrives at the replicate/annihilate gate, an annihilate pulse, different from the replicate pulse, is applied to the annihilate/replicate gate and the annihilate portion of the gate is selectively operated thereby annihilating the domain from the loop. New magnetic domains may now be synchronously generated and selectively stored in the loops in the manner previously discussed in regard to FIG. 3. This embodiment also has the advantages of a memory organization as shown in FIG. 3 with the added advantage of optional information retention during utilization.

Figure 5:
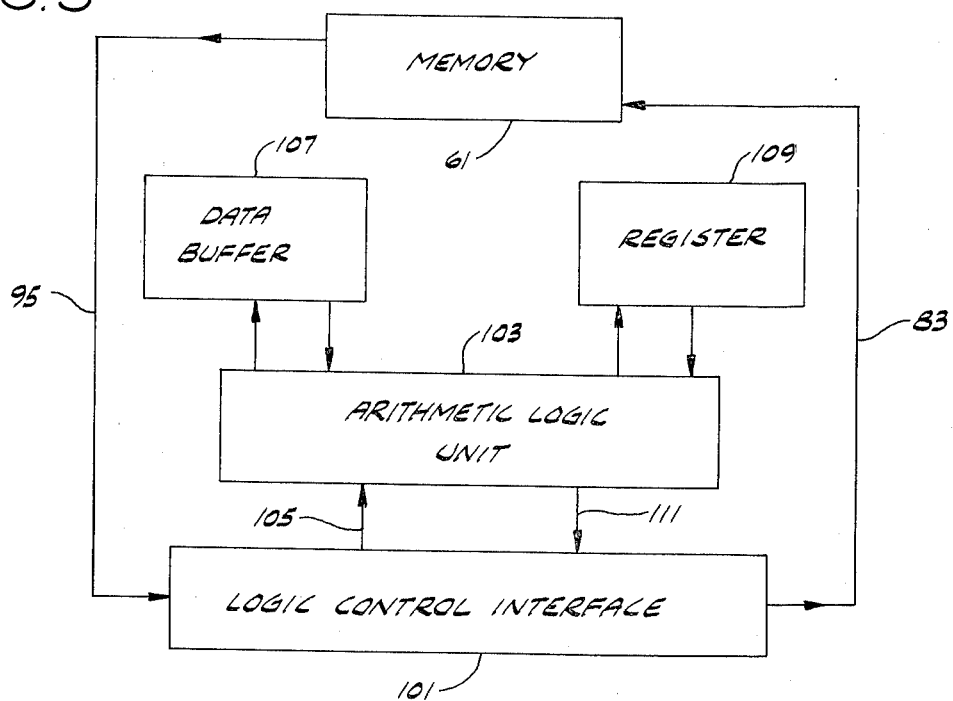
FIG. 5 is a block diagram of a functional memory system using the present invention.

FIG. 5 illustrates an application of the magnetic domain memory 61 of FIG. 3 in a typical functional system. Here, the read-modify-write capability of a memory 61 as well as the simultaneous read and write capability is demonstrated. The simultaneous read and write capability has been previously discussed. The read-modify-write capability allows information retrieved from memory 61 to be processed by a control and interface logic unit 101 and used in arithmetic operations in an arithmetic logic unit 103, with the results thereof being stored in memory 61 in the virtual positions previously occupied by the prior data. The output of the memory is routed along path 95 to control and interface unit 101 which processes the binary information received from the memory 61 and, through the interface portion of 101, provides an output to the arithmetic logic unit 103, via a path 105, which then performs one or a series of logic operations using this input and a data buffer 107 and a register 109, all components familiar to those in this art. Among the functions which may be performed by such a unit as 103 are unary operations in which the negative or complement of a number is generated, binary operations such as the adding, subtracting, anding, or oring of the contents of buffer 107 and register 109, and data relocation in which the contents of buffer 107 and register 109 are compared and the larger number then stored in the memory 61. At the completion of these operations, information to be stored in memory 61 is transferred back to the control and interface unit 101 via a path 111. The control and interface unit 101 then processes this output in the customary fashion and by providing the appropriate signals to the magnetic domain memory 61 via path 83 causes binary information to be generated and stored in the memory in the form of magnetic domains in the manner previously discussed.

As shown in FIG. 5, the logic control interface unit 101 includes many operational characteristics of the control circuit 70 shown in FIG. 3.

In view of the above, it will be seen that the several objects of the invention are achieved and other advantageous results are attained.

As various changes could be made in the above constructions without departing from the scope of the invention, it is intended that all matter contained in the above description or shown in the accompanying drawings shall be interpreted as illustrative and not in a limiting sense.

What is claimed is:

1. A magnetic domain memory comprising:
   a layer of magnetic material in which magnetic domains can be moved;
   means for causing the movement of magnetic domains within said material;
   at least one closed memory storage loop for the storage and guided movement of magnetic domains therearound, each magnetic domain in said loop having a virtual position with respect to all other magnetic domains in said loop;
   means for generating magnetic domains;
   an input path for the movement of magnetic domains from the generating means to the memory storage loop;
   means for detecting the presence of magnetic domains, said magnetic domain detection means including an output to provide a signal indicative of the detection of magnetic domains for desired information utilization;
   an output path, separate from said input path, for the movement of magnetic domains from the memory storage loop to the magnetic domain detection means;

a first one-way gate at a first point on the loop for transferring magnetic domains from the input path into the memory storage loop;

a second one-way gate at a second point on the loop for transferring magnetic domains from the memory storage loop to the output path; and control means synchronized with the movement of magnetic domains to selectively operate said first and second one-way gates and being responsive to the output of the magnetic domain detection means to actuate the magnetic domain generating means such that when a magnetic domain is detected by said magnetic domain detection means a signal will be provided to the control means to actuate the magnetic domain generating means to produce a magnetic domain for storage in the memory storage loop from which the detected magnetic domain originated, whereby when a magnetic domain is transferred out of its virtual position in the memory storage loop at the second point on the loop, a new magnetic domain may be transferred into the same virtual position when that virtual position next reaches the first point on the loop.

2. A magnetic domain memory comprising:

a layer of magnetic material in which magnetic domains can be moved;

means for causing the movement of magnetic domains within said material;

at least one closed memory storage loop for the storage and guided movement of magnetic domains therearound, each magnetic domain in said loop having a virtual position with respect to all other magnetic domains in said loop;

means for generating magnetic domains;

an input path for the movement of magnetic domains from the generating means to the memory storage loop;

means for detecting the presence of magnetic domains;

an output path, separate from said input path, for the movement of magnetic domains from the memory storage loop to the magnetic domain detection means;

a first one-way gate at a first point on the loop for transferring magnetic domains from the input path into the memory storage loop;

a second one-way gate at a second point on the loop for transferring magnetic domains from the memory storage loop to the output path, said second one-way gate including replicate means selectively operable to duplicate the magnetic domains stored in the memory storage loop when the virtual positions of said magnetic domains arrive at said second one-way gate at the second point on the memory storage loop; and control means synchronized with the movement of magnetic domains to selectively operate said first and second one-way gates whereby when a magnetic domain is transferred out of its virtual position in the memory storage loop at the second point on the loop, a new magnetic domain may be transferred into the same virtual position when that virtual position next reaches the first point on the loop.

3. A magnetic domain memory as set forth in claim 2 wherein the control means includes means for applying a first signal to the second one-way gate to duplicate magnetic domains and for providing a second signal, different from the first, to the second one-way gate to transfer magnetic domains from the memory storage loop to the output path, whereby when the first signal is applied to the second one-way gate, the original magnetic domains remain in their virtual positions in the memory storage loop while the duplicate domains are transferred to the output path and when the second signal is applied, the original magnetic domains are transferred from the memory storage loop to the output path for movement to the magnetic domain detection means.

4. A magnetic domain memory comprising:

a layer of magnetic material in which magnetic domains can be moved;

means for causing the movement of magnetic domains within said material;

a plurality of closed memory storage loops for the storage and guided movement of magnetic domains therearound, each magnetic domain in a respective loop having a virtual position with respect to all other magnetic domains in said respective loop;

means for generating magnetic domains;

an input path for the movement of magnetic domains from the generating means to the plurality of memory storage loops, said input path extending across one of the respective ends of each of the plurality of memory storage loops in spaced relation thereto;

means for detecting the presence of magnetic domains;

an output path, separate from said input path, for the movement of magnetic domains from the plurality of memory storage loops to the magnetic domain detection means, said output path extending across the opposite ends of each of said plurality of memory storage loops in spaced relation thereto;

a plurality of first one-way gates corresponding in number to the plurality of memory storage loops, each of said first one-way gates being disposed at a first point on the respective loop corresponding thereto for transferring magnetic domains from the input path into said respective memory storage loop;

a plurality of second one-way gates corresponding in number to the plurality of memory storage loops, each of said second one-way gates being disposed at a second point on the respective loop corresponding thereto for transferring magnetic domains from said respective memory storage loop to the output path; and control means synchronized with the movement of magnetic domains to selectively operate said first and second one-way gates and being responsive to the output of the magnetic domain detection means to actuate the magnetic domain generating means such that when a magnetic domain is detected by said magnetic domain detection means a signal will be provided to the control means to actuate the magnetic domain generating means to produce a magnetic domain for storage in the memory storage loop from which the detected magnetic domain originated, whereby when a magnetic domain is transferred out of its virtual position in one of said plurality of memory storage loops at the second point on said one loop, a new magnetic domain may be transferred into the same virtual position when that virtual position next reaches the first point on said one loop.

5. A magnetic domain memory comprising:

a layer of magnetic material in which magnetic domains can be moved;
means for causing the movement of magnetic domains within said material;
a plurality of closed memory storage loops for the storage and guided movement of magnetic domains therearound, each magnetic domain in a respective loop having a virtual position with respect to all other magnetic domains in said respective loop;
means for generating magnetic domains;
an input path for the movement of magnetic domains from the generating means to the plurality of memory storage loops, said input path extending across one of the respective ends of each of the plurality of memory storage loops in spaced relation thereto;
means for detecting the presence of magnetic domains;
an output path, separate from said input path, for the movement of magnetic domains from the plurality of memory storage loops to the magnetic domain detection means, said output path extending across the opposite ends of each of said plurality of memory storage loops in spaced relation thereto;
a plurality of first one-way gates corresponding in number to the plurality of memory storage loops, each of said first one-way gates being disposed at a first point on the respective loop corresponding thereto for transferring magnetic domains from the input path into said respective memory storage loop;
a plurality of second one-way gates corresponding in number to the plurality of memory storage loops, each of said second one-way gates being disposed at a second point on the respective loop corresponding thereto for transferring magnetic domains from said respective memory storage loop to the output path, each of said second one-way gates including replicate means selectively operable to duplicate the magnetic domains stored in the respective loop corresponding thereto when the virtual positions of said magnetic domains arrive at said second one-way gate at the second point on the loop; and
control means synchronized with the movement of magnetic domains to selectively operate said first and second one-way gate whereby when a magnetic domain is transferred out of its virtual position in one of said plurality of memory storage loops at the second point on said one loop a new magnetic domain may be transferred into the same position when that virtual position next reaches the first point on said one loop.

6. A magnetic domain memory as set forth in claim 5 wherein the control means includes means for applying a first signal to any of the second one-way gates to duplicate magnetic domains stored in the respective loop corresponding thereto and for providing a second signal, different from the first, to any of the second one-way gates to transfer magnetic domains from the respective loop corresponding thereto to the output path, whereby when the first signal is applied to one of the second one-way gates, the original magnetic domains remain in their virtual positions in the corresponding loop while the duplicate domains are transferred to the output path and when the second signal is applied, the original magnetic domains are transferred from the corresponding loop to the output path for movement to the magnetic domain detection means,

* * * * *